(12) United States Patent
Philbrook (10) Patent No.: US 7,642,786 B2
(45) Date of Patent: Jan. 5, 2010

(54) BATTERY TESTER CAPABLE OF IDENTIFYING FAULTY BATTERY POST ADAPTERS

(75) Inventor: John S. Philbrook, Cornelius, NC (US)

(73) Assignee: Midtronics, Inc., Willowbrook, IL (US)

( * ) Notice: Subject to any disclaimer, the term of this patent is extended or adjusted under 35 U.S.C. 154(b) by 716 days.

(21) Appl. No.: 11/141,234

(22) Filed: May 31, 2005

(65) Prior Publication Data

US 2005/0264296 A1    Dec. 1, 2005

Related U.S. Application Data

(60) Provisional application No. 60/575,945, filed on Jun. 1, 2004.

(51) Int. Cl.
*G01N 27/416* (2006.01)
(52) U.S. Cl. .................................................. 324/426
(58) Field of Classification Search ............... 324/426, 324/111, 411
See application file for complete search history.

(56) References Cited

U.S. PATENT DOCUMENTS

| | | | |
|---|---|---|---|
| 2,000,665 A | 5/1935 | Neal | 439/440 |
| 2,514,745 A | 7/1950 | Dalzell | 324/115 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |

(Continued)

FOREIGN PATENT DOCUMENTS

DE        29 26 716 B1    1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Patrick J Assouad
*Assistant Examiner*—M'Baye Diao
(74) *Attorney, Agent, or Firm*—Alan G. Rego; Westman, Champlin & Kelly P.A.

(57) ABSTRACT

An electronic battery tester for testing a storage battery. The tester includes a first connector configured to electrically couple to a first terminal of the battery via a first battery post adapter and a second connector configured to electrically couple to a second terminal of the battery via a second battery post adapter. The tester also includes an input configured to receive a battery-post-adapter-connection indicator. Test circuitry, which is coupled to the input, upon receipt of the battery-post-adapter-connection indicator, determines whether or not the first battery post adapter and the second battery post adapter are faulty.

5 Claims, 4 Drawing Sheets

U.S. PATENT DOCUMENTS

| | | | |
|---|---|---|---|
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 320/116.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A * | 7/1991 | Bokitch | 324/503 |
| 5,032,825 A | 7/1991 | Kuznicki | 340/636.15 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,126,675 A | 6/1992 | Yang | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |

| | | | |
|---|---|---|---|
| 5,347,163 A | 9/1994 | Yoshimura ................... 307/66 |
| 5,352,968 A | 10/1994 | Reni et al. ................... 320/136 |
| 5,357,519 A | 10/1994 | Martin et al. ............... 371/15.1 |
| 5,365,160 A | 11/1994 | Leppo et al. ................. 320/160 |
| 5,365,453 A | 11/1994 | Startup et al. ................. 702/36 |
| 5,369,364 A | 11/1994 | Renirie et al. ............... 324/430 |
| 5,381,096 A | 1/1995 | Hirzel ....................... 324/427 |
| 5,410,754 A | 4/1995 | Klotzbach et al. ........... 370/466 |
| 5,412,308 A | 5/1995 | Brown ....................... 323/267 |
| 5,412,323 A | 5/1995 | Kato et al. .................. 324/427 |
| 5,426,371 A | 6/1995 | Salley et al. ................. 324/429 |
| 5,426,416 A | 6/1995 | Jefferies et al. ............. 340/664 |
| 5,432,025 A | 7/1995 | Cox ............................. 429/65 |
| 5,432,426 A | 7/1995 | Yoshida ..................... 320/160 |
| 5,434,495 A | 7/1995 | Toko ......................... 320/135 |
| 5,435,185 A | 7/1995 | Eagan ......................... 73/587 |
| 5,442,274 A | 8/1995 | Tamai ........................ 320/146 |
| 5,445,026 A | 8/1995 | Eagan ......................... 73/591 |
| 5,449,996 A | 9/1995 | Matsumoto et al. ......... 320/148 |
| 5,449,997 A | 9/1995 | Gilmore et al. .............. 320/148 |
| 5,451,881 A | 9/1995 | Finger ........................ 324/433 |
| 5,453,027 A | 9/1995 | Buell et al. .................. 439/433 |
| 5,457,377 A | 10/1995 | Jonsson ...................... 324/430 |
| 5,469,043 A | 11/1995 | Cherng et al. ................ 320/161 |
| 5,485,090 A | 1/1996 | Stephens .................... 324/433 |
| 5,488,300 A | 1/1996 | Jamieson .................... 324/432 |
| 5,519,383 A | 5/1996 | De La Rosa ........... 340/636.15 |
| 5,528,148 A | 6/1996 | Rogers ....................... 320/137 |
| 5,537,967 A | 7/1996 | Tashiro et al. .............. 123/192.1 |
| 5,541,489 A | 7/1996 | Dunstan ..................... 320/134 |
| 5,546,317 A | 8/1996 | Andrieu ........................ 702/63 |
| 5,548,273 A | 8/1996 | Nicol et al. .................. 340/439 |
| 5,550,485 A | 8/1996 | Falk ........................... 324/772 |
| 5,561,380 A | 10/1996 | Sway-Tin et al. ........... 324/509 |
| 5,562,501 A | 10/1996 | Kinoshita et al. ............ 439/852 |
| 5,563,496 A | 10/1996 | McClure ..................... 320/128 |
| 5,572,136 A | 11/1996 | Champlin ................... 324/426 |
| 5,574,355 A | 11/1996 | McShane et al. ............ 320/161 |
| 5,578,915 A | 11/1996 | Crouch, Jr. et al. .......... 324/428 |
| 5,583,416 A | 12/1996 | Klang ......................... 320/160 |
| 5,585,728 A | 12/1996 | Champlin ................... 324/427 |
| 5,589,757 A | 12/1996 | Klang ......................... 320/160 |
| 5,592,093 A | 1/1997 | Klingbiel .................... 324/426 |
| 5,592,094 A | 1/1997 | Ichikawa .................... 324/427 |
| 5,596,260 A | 1/1997 | Moravec et al. ............. 320/135 |
| 5,598,098 A | 1/1997 | Champlin ................... 324/430 |
| 5,602,462 A | 2/1997 | Stich et al. .................. 323/258 |
| 5,606,242 A | 2/1997 | Hull et al. ................... 320/106 |
| 5,614,788 A | 3/1997 | Mullins et al. ................ 315/82 |
| 5,621,298 A | 4/1997 | Harvey ....................... 320/134 |
| 5,633,985 A | 5/1997 | Severson et al. ............. 704/267 |
| 5,637,978 A | 6/1997 | Kellett et al. ................ 320/104 |
| 5,642,031 A | 6/1997 | Brotto ........................ 320/156 |
| 5,650,937 A | 7/1997 | Bounaga ....................... 702/65 |
| 5,652,501 A | 7/1997 | McClure et al. ........ 340/636.15 |
| 5,653,659 A | 8/1997 | Kunibe et al. ................ 477/111 |
| 5,654,623 A | 8/1997 | Shiga et al. ................. 320/106 |
| 5,656,920 A | 8/1997 | Cherng et al. ............... 324/431 |
| 5,661,368 A | 8/1997 | Deol et al. .................... 315/82 |
| 5,675,234 A | 10/1997 | Greene .................. 340/636.11 |
| 5,677,077 A | 10/1997 | Faulk ........................... 429/90 |
| 5,699,050 A | 12/1997 | Kanazawa ............. 340/636.13 |
| 5,701,089 A | 12/1997 | Perkins ....................... 324/772 |
| 5,705,929 A | 1/1998 | Caravello et al. ............ 324/430 |
| 5,707,015 A | 1/1998 | Guthrie ...................... 241/120 |
| 5,710,503 A | 1/1998 | Sideris et al. ................ 320/116 |
| 5,711,648 A | 1/1998 | Hammerslag ............... 414/800 |
| 5,717,336 A | 2/1998 | Basell et al. ................. 324/430 |
| 5,717,937 A | 2/1998 | Fritz ........................... 713/300 |
| 5,739,667 A | 4/1998 | Matsuda et al. ............. 320/128 |
| 5,745,044 A | 4/1998 | Hyatt, Jr. et al. ............ 340/5.23 |
| 5,747,909 A | 5/1998 | Syverson et al. ......... 310/156.56 |
| 5,747,967 A | 5/1998 | Muljadi et al. ............... 320/148 |
| 5,754,417 A | 5/1998 | Nicollini ....................... 363/60 |
| 5,757,192 A | 5/1998 | McShane et al. ............ 324/427 |
| 5,760,587 A | 6/1998 | Harvey ....................... 324/434 |
| 5,772,468 A | 6/1998 | Kowalski et al. ............ 439/506 |
| 5,773,978 A | 6/1998 | Becker ....................... 324/430 |
| 5,780,974 A | 7/1998 | Pabla et al. .................... 315/82 |
| 5,780,980 A | 7/1998 | Naito ......................... 318/139 |
| 5,789,899 A | 8/1998 | van Phuoc et al. .......... 320/112 |
| 5,793,359 A | 8/1998 | Ushikubo ................... 345/169 |
| 5,796,239 A | 8/1998 | van Phuoc et al. .......... 320/107 |
| 5,808,469 A | 9/1998 | Kopera ....................... 324/434 |
| 5,811,979 A | 9/1998 | Rhein ......................... 324/718 |
| 5,818,234 A | 10/1998 | McKinnon .................. 324/433 |
| 5,821,756 A | 10/1998 | McShane et al. ............ 324/430 |
| 5,821,757 A | 10/1998 | Alvarez et al. .............. 324/434 |
| 5,825,174 A | 10/1998 | Parker ........................ 324/106 |
| 5,831,435 A | 11/1998 | Troy .......................... 324/426 |
| 5,850,113 A | 12/1998 | Weimer et al. .............. 307/125 |
| 5,862,515 A | 1/1999 | Kobayashi et al. ............ 702/63 |
| 5,865,638 A | 2/1999 | Trafton ....................... 439/288 |
| 5,872,443 A | 2/1999 | Williamson ................. 320/160 |
| 5,872,453 A | 2/1999 | Shimoyama et al. ........ 324/431 |
| 5,895,440 A | 4/1999 | Proctor et al. ................. 702/63 |
| 5,903,154 A | 5/1999 | Zhang et al. ................. 324/437 |
| 5,912,534 A | 6/1999 | Benedict ...................... 315/82 |
| 5,914,605 A | 6/1999 | Bertness ..................... 324/430 |
| 5,927,938 A | 7/1999 | Hammerslag ............... 414/809 |
| 5,929,609 A | 7/1999 | Joy et al. ...................... 322/25 |
| 5,939,855 A | 8/1999 | Proctor et al. ............... 320/104 |
| 5,939,861 A | 8/1999 | Joko et al. ................... 320/122 |
| 5,945,829 A | 8/1999 | Bertness ..................... 324/430 |
| 5,951,229 A | 9/1999 | Hammerslag ............... 414/398 |
| 5,961,561 A | 10/1999 | Wakefield, II ................ 701/29 |
| 5,961,604 A | 10/1999 | Anderson et al. ........... 709/229 |
| 5,969,625 A | 10/1999 | Russo .................. 340/636.19 |
| 5,978,805 A | 11/1999 | Carson ......................... 707/10 |
| 5,982,138 A | 11/1999 | Krieger ...................... 320/105 |
| 6,002,238 A | 12/1999 | Champlin ................... 320/134 |
| 6,005,759 A | 12/1999 | Hart et al. ..................... 361/66 |
| 6,008,652 A | 12/1999 | Theofanopoulos et al. .. 324/434 |
| 6,009,369 A | 12/1999 | Boisvert et al. ................ 701/99 |
| 6,016,047 A | 1/2000 | Notten et al. ................ 320/137 |
| 6,031,354 A | 2/2000 | Wiley et al. ................. 320/116 |
| 6,031,368 A | 2/2000 | Klippel et al. ............... 324/133 |
| 6,037,751 A | 3/2000 | Klang ......................... 320/160 |
| 6,037,777 A | 3/2000 | Champlin ................... 324/430 |
| 6,037,778 A | 3/2000 | Makhija ..................... 324/433 |
| 6,046,514 A | 4/2000 | Rouillard et al. .............. 307/77 |
| 6,051,976 A | 4/2000 | Bertness ..................... 324/426 |
| 6,055,468 A | 4/2000 | Kaman et al. ................. 701/29 |
| 6,061,638 A * | 5/2000 | Joyce ............................ 702/63 |
| 6,064,372 A | 5/2000 | Kahkoska ................... 345/173 |
| 6,072,299 A | 6/2000 | Kurle et al. .................. 320/112 |
| 6,072,300 A | 6/2000 | Tsuji .......................... 320/116 |
| 6,081,098 A | 6/2000 | Bertness et al. .............. 320/134 |
| 6,081,109 A | 6/2000 | Seymour et al. ............. 324/127 |
| 6,091,238 A | 7/2000 | McDermott .............. 324/207.2 |
| 6,091,245 A | 7/2000 | Bertness ..................... 324/426 |
| 6,094,033 A | 7/2000 | Ding et al. ................... 320/132 |
| 6,100,670 A | 8/2000 | Levesque .................... 320/150 |
| 6,104,167 A | 8/2000 | Bertness et al. .............. 320/132 |
| 6,114,834 A | 9/2000 | Parise ......................... 320/109 |
| 6,137,269 A | 10/2000 | Champlin ................... 320/150 |
| 6,140,797 A | 10/2000 | Dunn ......................... 320/105 |
| 6,144,185 A | 11/2000 | Dougherty et al. .......... 320/132 |
| 6,150,793 A | 11/2000 | Lesesky et al. .............. 320/104 |
| 6,158,000 A | 12/2000 | Collins ......................... 713/1 |
| 6,161,640 A | 12/2000 | Yamaguchi ................ 180/65.8 |
| 6,163,156 A | 12/2000 | Bertness ..................... 324/426 |
| 6,167,349 A | 12/2000 | Alvarez ........................ 702/63 |
| 6,172,483 B1 | 1/2001 | Champlin ................... 320/134 |
| 6,172,505 B1 | 1/2001 | Bertness ..................... 324/430 |
| 6,181,545 B1 | 1/2001 | Amatucci et al. ............ 361/502 |

| | | | | | | |
|---|---|---|---|---|---|---|
| 6,211,651 B1 | 4/2001 | Nemoto | 320/133 | 6,696,819 B2 | 2/2004 | Bertness | 320/134 |
| 6,215,275 B1 | 4/2001 | Bean | 320/106 | 6,707,303 B2 * | 3/2004 | Bertness et al. | 324/426 |
| 6,222,342 B1 | 4/2001 | Eggert et al. | 320/105 | 6,737,831 B2 | 5/2004 | Champlin | 320/132 |
| 6,222,369 B1 | 4/2001 | Champlin | 324/430 | 6,759,849 B2 | 7/2004 | Bertness et al. | 324/426 |
| D442,503 S | 5/2001 | Lundbeck et al. | D10/77 | 6,777,945 B2 | 8/2004 | Roberts et al. | 324/426 |
| 6,225,808 B1 | 5/2001 | Varghese et al. | 324/426 | 6,781,382 B2 | 8/2004 | Johnson | 324/426 |
| 6,236,332 B1 | 5/2001 | Conkright et al. | 340/3.1 | 6,784,637 B2 | 8/2004 | Raichle et al. | 320/107 |
| 6,238,253 B1 | 5/2001 | Qualls | 439/759 | 6,788,025 B2 | 9/2004 | Bertness et al. | 320/104 |
| 6,242,887 B1 | 6/2001 | Burke | 320/104 | 6,795,782 B2 | 9/2004 | Bertness et al. | 702/63 |
| 6,249,124 B1 | 6/2001 | Bertness | 324/426 | 6,805,090 B2 | 10/2004 | Bertness et al. | 123/198 |
| 6,250,973 B1 | 6/2001 | Lowery et al. | 439/763 | 6,806,716 B2 | 10/2004 | Bertness et al. | 324/426 |
| 6,254,438 B1 | 7/2001 | Gaunt | 439/755 | 6,825,669 B2 | 11/2004 | Raichle et al. | 324/426 |
| 6,259,170 B1 | 7/2001 | Limoge et al. | 307/10.8 | 6,842,707 B2 | 1/2005 | Raichle et al. | 702/62 |
| 6,259,254 B1 | 7/2001 | Klang | 324/427 | 6,850,037 B2 | 2/2005 | Bertness | 320/132 |
| 6,262,563 B1 | 7/2001 | Champlin | 320/134 | 6,871,151 B2 | 3/2005 | Bertness | 702/63 |
| 6,263,268 B1 | 7/2001 | Nathanson | 701/29 | 7,003,410 B2 * | 2/2006 | Bertness et al. | 702/63 |
| 6,271,643 B1 | 8/2001 | Becker et al. | 320/112 | 2002/0010558 A1 | 1/2002 | Bertness et al. | 702/63 |
| 6,275,008 B1 | 8/2001 | Arai et al. | 320/132 | 2002/0171428 A1 | 11/2002 | Bertness | 702/63 |
| 6,294,896 B1 | 9/2001 | Champlin | 320/134 | 2002/0176010 A1 | 11/2002 | Wallach et al. | 348/362 |
| 6,294,897 B1 | 9/2001 | Champlin | 320/153 | 2003/0025481 A1 | 2/2003 | Bertness | 324/427 |
| 6,304,087 B1 | 10/2001 | Bertness | 324/426 | 2003/0036909 A1 | 2/2003 | Kato | 704/275 |
| 6,307,349 B1 | 10/2001 | Koenck et al. | 320/112 | 2003/0088375 A1 * | 5/2003 | Bertness et al. | 702/63 |
| 6,310,481 B2 | 10/2001 | Bertness | 324/430 | 2003/0184262 A1 | 10/2003 | Makhija | 320/156 |
| 6,313,607 B1 | 11/2001 | Champlin | 320/132 | 2003/0184306 A1 | 10/2003 | Bertness et al. | 324/427 |
| 6,313,608 B1 | 11/2001 | Varghese et al. | 320/132 | 2003/0194672 A1 | 10/2003 | Roberts et al. | 431/196 |
| 6,316,914 B1 | 11/2001 | Bertness | 320/134 | 2004/0000590 A1 | 1/2004 | Raichle et al. | 235/462.01 |
| 6,323,650 B1 | 11/2001 | Bertness et al. | 324/426 | 2004/0000893 A1 | 1/2004 | Raichle et al. | 320/135 |
| 6,329,793 B1 | 12/2001 | Bertness et al. | 320/132 | 2004/0002824 A1 | 1/2004 | Raichle et al. | 702/63 |
| 6,331,762 B1 | 12/2001 | Bertness | 320/134 | 2004/0002825 A1 | 1/2004 | Raichle et al. | 702/63 |
| 6,332,113 B1 | 12/2001 | Bertness | 702/63 | 2004/0049361 A1 | 3/2004 | Hamdan et al. | 702/115 |
| 6,346,795 B2 | 2/2002 | Haraguchi et al. | 320/136 | 2004/0051533 A1 | 3/2004 | Namaky | 324/426 |
| 6,347,958 B1 | 2/2002 | Tsai | 439/488 | 2004/0054503 A1 | 3/2004 | Namaky | 702/182 |
| 6,351,102 B1 | 2/2002 | Troy | 320/139 | | | | |
| 6,356,042 B1 | 3/2002 | Kahlon et al. | 318/138 | FOREIGN PATENT DOCUMENTS | | | |
| 6,359,441 B1 | 3/2002 | Bertness | 324/426 | EP | 0 022 450 A1 | 1/1981 | |
| 6,359,442 B1 | 3/2002 | Henningson et al. | 324/426 | EP | 0 637 754 A1 | 2/1995 | |
| 6,363,303 B1 | 3/2002 | Bertness | 701/29 | EP | 0 772 056 A1 | 5/1997 | |
| RE37,677 E | 4/2002 | Irie | 315/83 | FR | 2 749 397 | 12/1997 | |
| 6,384,608 B1 | 5/2002 | Namaky | 324/430 | GB | 2 029 586 | 3/1980 | |
| 6,388,448 B1 | 5/2002 | Cervas | 324/426 | GB | 2 088 159 A | 6/1982 | |
| 6,392,414 B2 | 5/2002 | Bertness | 324/429 | GB | 2 246 916 A | 10/1990 | |
| 6,396,278 B1 | 5/2002 | Makhija | 324/402 | GB | 2 387 235 A | 10/2003 | |
| 6,411,098 B1 | 6/2002 | Laletin | 324/436 | JP | 59-17892 | 1/1984 | |
| 6,417,669 B1 | 7/2002 | Champlin | 324/426 | JP | 59-17893 | 1/1984 | |
| 6,424,157 B1 | 7/2002 | Gollomp et al. | 324/430 | JP | 59-17894 | 1/1984 | |
| 6,424,158 B2 | 7/2002 | Klang | 324/433 | JP | 59017894 | 1/1984 | |
| 6,441,585 B1 | 8/2002 | Bertness | 320/132 | JP | 59215674 | 12/1984 | |
| 6,445,158 B1 | 9/2002 | Bertness et al. | 320/104 | JP | 60225078 | 11/1985 | |
| 6,449,726 B1 | 9/2002 | Smith | 713/340 | JP | 62-180284 | 8/1987 | |
| 6,456,045 B1 | 9/2002 | Troy et al. | 320/139 | JP | 63027776 | 2/1988 | |
| 6,466,025 B1 | 10/2002 | Klang | 324/427 | JP | 03274479 | 12/1991 | |
| 6,466,026 B1 | 10/2002 | Champlin | 324/430 | JP | 03282276 | 12/1991 | |
| 6,469,511 B1 | 10/2002 | Vonderhaar et al. | 324/425 | JP | 4-8636 | 1/1992 | |
| 6,495,990 B2 | 12/2002 | Champlin | 320/132 | JP | 04095788 | 3/1992 | |
| 6,526,361 B1 | 2/2003 | Jones et al. | 702/63 | JP | 04131779 | 5/1992 | |
| 6,531,848 B1 | 3/2003 | Chitsazan et al. | 320/153 | JP | 04372536 | 12/1992 | |
| 6,534,993 B2 | 3/2003 | Bertness | 324/433 | JP | 5216550 | 8/1993 | |
| 6,544,078 B2 | 4/2003 | Palmisano et al. | 439/762 | JP | 7-128414 | 5/1995 | |
| 6,556,019 B2 | 4/2003 | Bertness | 324/426 | JP | 09061505 | 3/1997 | |
| 6,566,883 B1 * | 5/2003 | Vonderhaar et al. | 324/426 | JP | 10056744 | 2/1998 | |
| 6,570,385 B1 | 5/2003 | Roberts et al. | 324/378 | JP | 10232273 | 9/1998 | |
| 6,577,107 B2 | 6/2003 | Kechmire | 320/139 | JP | 11103503 A | 4/1999 | |
| 6,586,941 B2 * | 7/2003 | Bertness et al. | 324/426 | RU | 2089015 C1 | 8/1997 | |
| 6,597,150 B1 | 7/2003 | Bertness et al. | 320/104 | WO | WO 93/22666 | 11/1993 | |
| 6,600,815 B1 | 7/2003 | Walding | 379/93.07 | WO | WO 94/05069 | 3/1994 | |
| 6,618,644 B2 | 9/2003 | Bean | 700/231 | WO | WO 97/44652 | 11/1997 | |
| 6,621,272 B2 | 9/2003 | Champlin | 324/426 | WO | WO 98/04910 | 2/1998 | |
| 6,623,314 B1 | 9/2003 | Cox et al. | 439/759 | WO | WO 98/58270 | 12/1998 | |
| 6,628,011 B2 | 9/2003 | Droppo et al. | 307/43 | WO | WO 99/23738 | 5/1999 | |
| 6,629,054 B2 | 9/2003 | Makhija et al. | 702/113 | WO | WO 00/16083 | 3/2000 | |
| 6,633,165 B2 | 10/2003 | Bertness | 324/426 | WO | WO 00/62049 | 10/2000 | |
| 6,667,624 B1 | 12/2003 | Raichle et al. | 324/522 | WO | WO 00/67359 | 11/2000 | |
| 6,679,212 B2 | 1/2004 | Kelling | 123/179.28 | | | | |

| | | |
|---|---|---|
| WO | WO 01/59443 | 2/2001 |
| WO | WO 01/16614 | 3/2001 |
| WO | WO 01/16615 | 3/2001 |
| WO | WO 01/51947 | 7/2001 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Diffusion Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, p. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2: 629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Supplementary European Search Report Communication for Appl. No. 99917402.2.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the U.K. Patent Office for U.K. App. No. 0417678.0.

* cited by examiner

BATTERY TESTER CAPABLE OF IDENTIFYING FAULTY BATTERY POST ADAPTERS

The present application is based on and claims the benefit of U.S. provisional patent application Ser. No. 60/575,945, filed Jun. 1, 2004, the content of which is hereby incorporated by reference in its entirety.

BACKGROUND OF THE INVENTION

The present invention generally relates to testing of storage batteries. More specifically, the present invention relates to a battery tester that is capable of identifying faulty battery post adapters.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically, each cell has a voltage potential of about 2.1 volts. By connecting the cells in series, the voltage of the individual cells are added in a cumulative manner. For example, in a typical automotive storage battery, six storage cells are used to provide a total voltage when the battery is fully charged up to 12.6 volts.

Several techniques have been used to test the condition of storage batteries. These techniques include a voltage test to determine if the battery voltage is below a certain threshold, and a load test that involves discharging a battery using a known load.

More recently, a technique has been pioneered by Dr. Keith S. Champlin and Midtronics, Inc. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPA- RATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744,149, issued Jun. 1, 2004, entitled SYSTEM AND METHOD FOR PROVIDING STEP-DOWN POWER CONVERSION USING AN INTELLIGENT SWITCH; U.S. Pat. No. 6,759,849, issued Jul. 6, 2004, entitled BATTERY TESTER CONFIGURED TO RECEIVE A REMOVABLE DIGITAL MODULE; U.S. Pat. No. 6,781,382, issued Aug. 24, 2004, entitled ELECTRONIC BATTERY TESTER; U.S. Pat. No. 6,788,025, filed Sep. 7, 2004, entitled BATTERY CHARGER WITH BOOSTER PACK; U.S. Pat. No. 6,795,782, issued Sep. 21, 2004, entitled BATTERY TEST MODULE; U.S. Pat. No. 6,805,090, filed Oct. 19, 2004, entitled CHARGE CONTROL SYSTEM FOR A VEHICLE BATTERY; U.S. Pat. No. 6,806,716, filed Oct. 19, 2004, entitled ELECTRONIC BATTERY TESTER; U.S. Pat. No. 6,850,037, filed Feb. 1, 2005, entitled IN-VEHICLE BATTERY MONITORING; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS; U.S. Ser. No. 60/575,945, filed Jun. 1, 2004, entitled BATTERY TESTER CAPABLE OF IDENTIFYING FAULTY BATTERY POST ADAPTERS; U.S. Ser. No. 60/577,345, filed Jun. 4, 2004, entitled NEW METHOD FOR AUTOMATICALLY TESTING A BATTERY AND TRANSMITTING DATA TO ANOTHER MODULE IN. A VEHICLE; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/870,680, filed Jun. 17, 2004, entitled ELECTRONIC BATTERY TESTER WITH RELATIVE TEST OUTPUT; U.S. Ser. No. 60/582,925, filed Jun. 25, 2004, entitled BATTERY TESTER WITH BATTERY POTENTIAL FOR RECOVERY OUTPUT; U.S. Ser. No. 10/883,019, filed Jul. 1, 2004, entitled MODULAR ELECTRONIC BATTERY TESTER; U.S. Ser. No. 60/585,700, filed Jul. 6, 2004, entitled TEST STATION; U.S. Ser. No. 60/587,232, filed Jul. 12, 2004, entitled WIRELESS BATTERY TESTER; U.S. Ser. No. 10/896,835, filed Jul. 22, 2004, entitled BROADBAND LOW-INDUCTANCE CABLES FOR MAKING KELVIN CONNECTIONS TO ELECTROCHEMICAL CELLS AND BATTERIES; U.S. Ser. No. 10/896,834, filed Jul. 22, 2004, entitled ELECTRONIC BATTERY TESTER; U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLE; U.S. Ser. No. 10/914,304, filed Aug. 9, 2004, entitled ELECTRONIC BATTERY TESTER WITH NETWORK COMMUNICATION; U.S. Ser. No. 60/603,078, filed Aug. 20, 2004, entitled SYSTEM FOR AUTOMATICALLY GATHERING BATTERY INFORMATION FOR USE DURING BATTERY TESTING/CHARGING; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; which are incorporated herein in their entirety.

In general, battery test results provided by the above-noted battery testers are based on, or influenced by, battery resistance/conductance. Therefore, such testers may fail to provide accurate test results when electrically coupled to posts of a battery under test via relatively high-resistance battery post adapters (faulty battery post adapters). This is because a resistance of each battery post adapter appears to the tester as being a part of the battery resistance.

SUMMARY OF THE INVENTION

An electronic battery tester for testing a storage battery is provided. The tester includes a first connector configured to electrically couple to a first terminal of the battery via a first battery post adapter and a second connector configured to electrically couple to a second terminal of the battery via a second battery post adapter. The tester also includes an input configured to receive a battery-post-adapter-connection indicator. Test circuitry, which is coupled to the input, upon receipt of the battery-post-adapter-connection indicator, determines whether or not the first battery post adapter and the second battery post adapter are faulty.

DETAILED DESCRIPTION OF THE PREFERRED EMBODIMENTS

Figure 1:
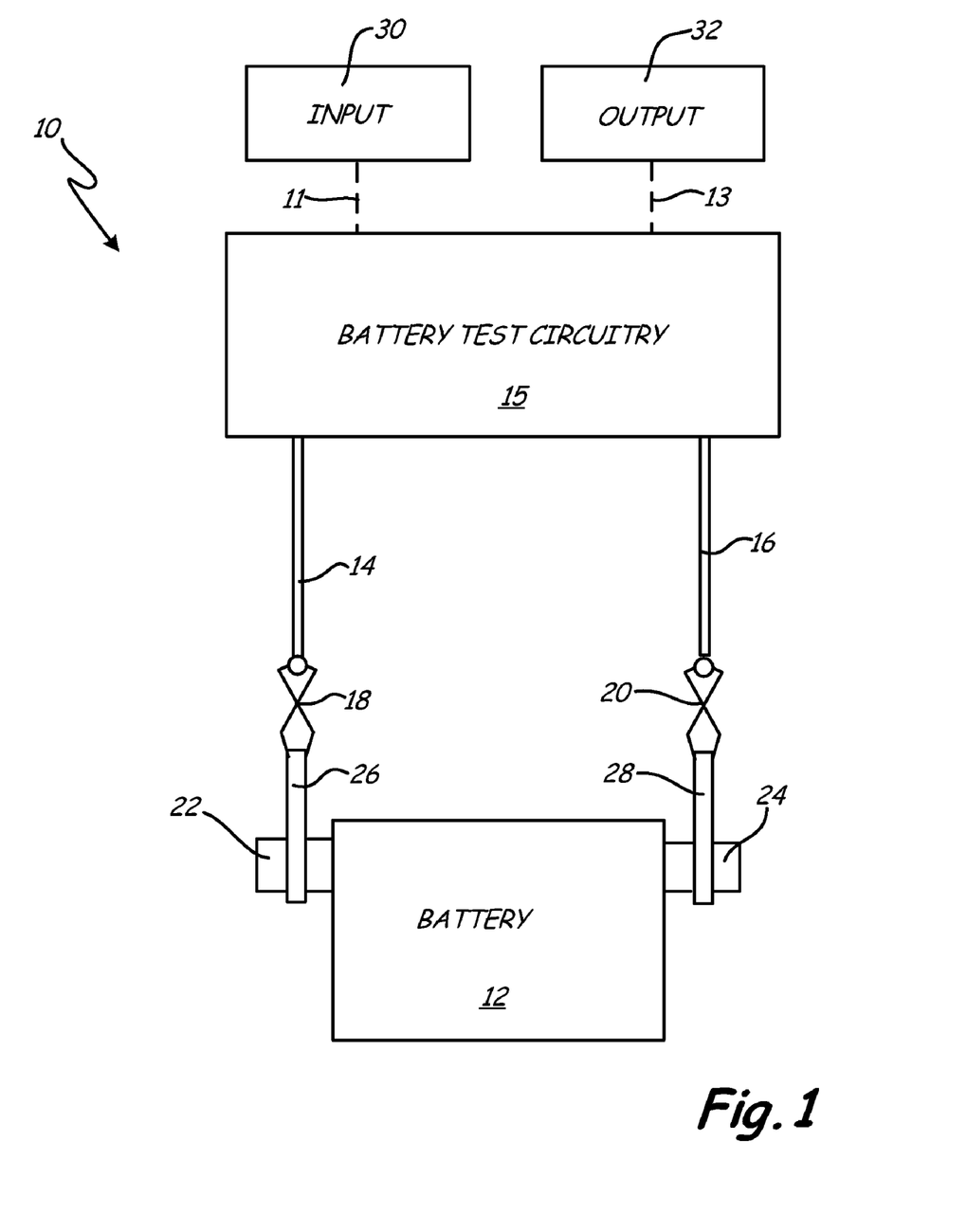
FIG. 1 is a simplified block diagram of a battery tester in accordance with an embodiment of the present invention.

FIG. 1 is a simplified block diagram of an embodiment of a battery tester 10 of the present invention, which is coupled to a battery 12. The same reference numerals are used in the various figures to represent the same or similar elements. Battery 12 has a first post 22 and a second post 24. As can be seen in FIG. 1, a first post adapter 26 and a second post adapter 28 are coupled to first post 22 and second post 24, respectively. In general, post adapters (such as 26 and 28) are utilized to facilitate easy and convenient connection and disconnection to a battery (such as 12) that includes battery posts (such as 22 and 24), that may not be easily accessible when the battery is used in certain applications. As can be seen in FIG. 1, battery test circuitry 15 is coupled to first battery post adapter 26 via first cable 14 and first clamp 18. Similarly, battery test circuitry 15 is coupled to second post adapter 28 via second cable 16 and second clamp 20. In addition to test circuitry 15, cables 14 and 16, and clamps 18 and 20, battery tester 10 includes an input device 30 and an output device 32, which are coupled to test circuitry 15. Input 30 can be, for example, a push button, a keypad input or other user input. Output 32 can be, for example, any type of visual indicator or display, or even a printer, which is capable of providing a user with battery test results and other related information. It should be noted that input 30 and output 32 may be proximate to, or remote from, battery test circuitry 15. Communication links 11 and 13 (which connect input 30 and output 32, respectively, to battery test circuitry 15) may be any type of communication links, such as hard wired communication links, wireless communication links, optical communication links, etc.

As mentioned earlier, faulty battery post adapters (post adapters that have relatively high resistance values) can negatively impact battery test results. Prior art battery testers are unable to determine whether or not the battery post adapters are faulty.

Under the present invention, battery test circuitry 15 is capable of receiving a battery-post-adapter-connection indicator (indicating that tester 10 is electrically coupled to battery 12 via battery post adapters such as 26 and 28), which is input/selected by a tester user from input device 30. Upon receiving the battery-post-adapter-connection indicator, battery test circuitry 15 carries out a check to determine whether or not post adapters such as 26 and 28 are faulty. If battery test circuitry 15 determines that post adapters 26 and 28 are faulty, it notifies the user via output device 32.

Figure 2:
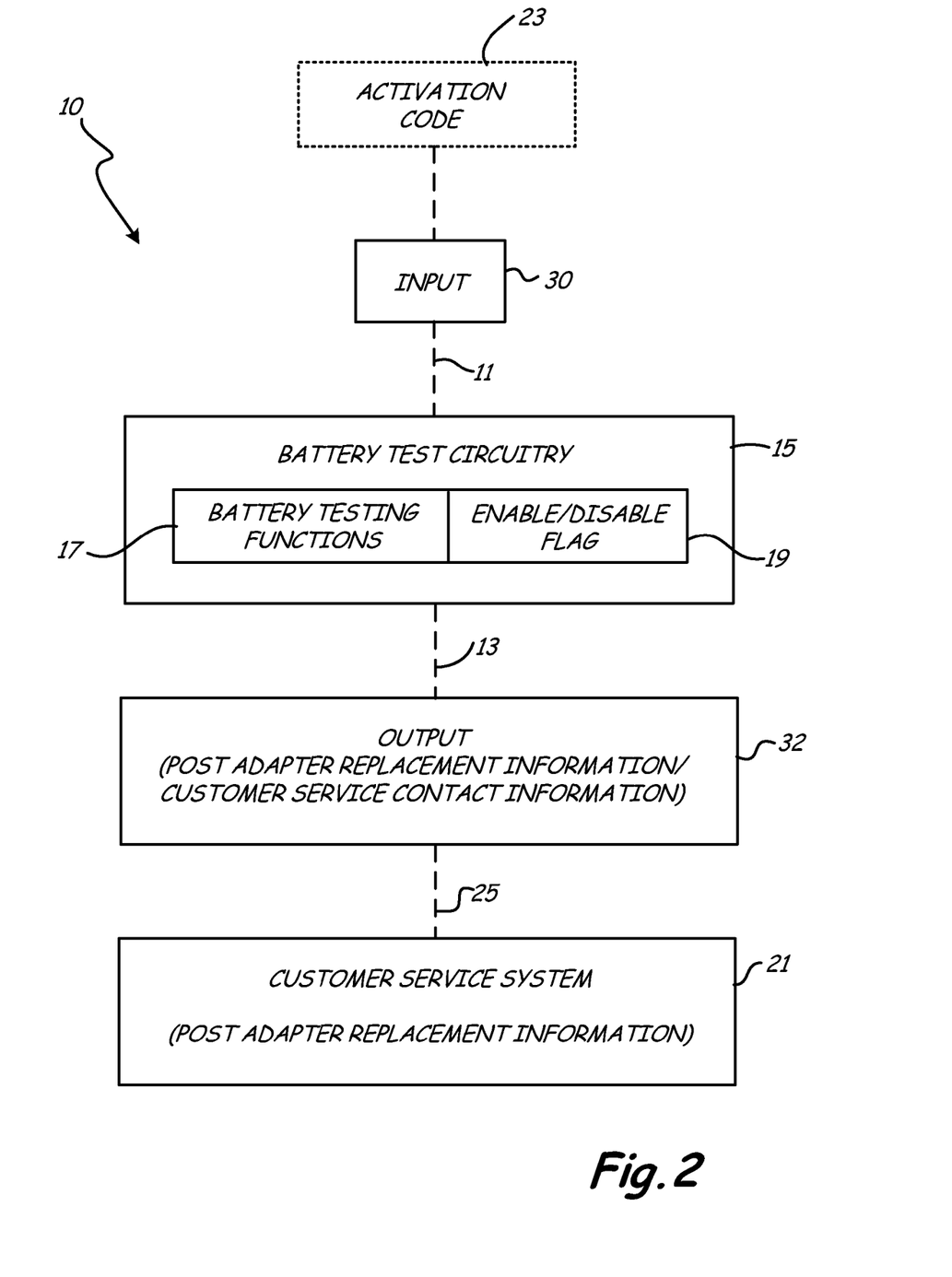
FIG. 2 is a simplified block diagram of a battery tester that provides battery post adapter replacement information in accordance with an embodiment of the present invention.

FIG. 2 is a simplified block diagram of a battery tester that provides battery post adapter replacement information in accordance with an embodiment of the present invention. In the embodiment shown in FIG. 2, upon detection of faulty post adapters, test circuitry 15 can instruct the user, via output 32, to call a 1-800 number, for example, and enter a specific code. A customer service system 21, to which the call is directed, upon receipt of the code, will instruct the user to replace the faulty post adapters with suitable post adapters. In some embodiments, a suitable type of post adapter will be recommended to the user by customer service system 21.

In some embodiments, upon detection of faulty post adapters, a number of primary battery testing functions 17 of tester 10 are disabled by test circuitry 15 by setting an enable/disable flag 19 to an appropriate value. In such embodiments, test circuitry 15 is configured to enable battery testing functions 17 by resetting enable/disable flag 19 upon receipt of a predetermined code or sequence (activation code 23, for example) via input 30. The sequence may be date-related (a function of date) so that it can change regularly. The sequence is provided by customer service system 21 to the tester user.

In general, as mentioned above, output 32 can provide customer service contact information for use by a tester user to contact customer services 21 and/or post adapter replacement information. In some embodiments of the present invention, battery tester 10 is linked to customer service system 21 via communication link 25, which may be any suitable type or wired or wireless link. In such embodiments, tester 10 can receive automatic periodic updates of information from system 21 and/or receive information from system 21 upon request. Components of battery test circuitry 15 and details regarding how battery test circuitry detects faulty post adapters are described further below in connection with FIG. 3.

Figure 3:
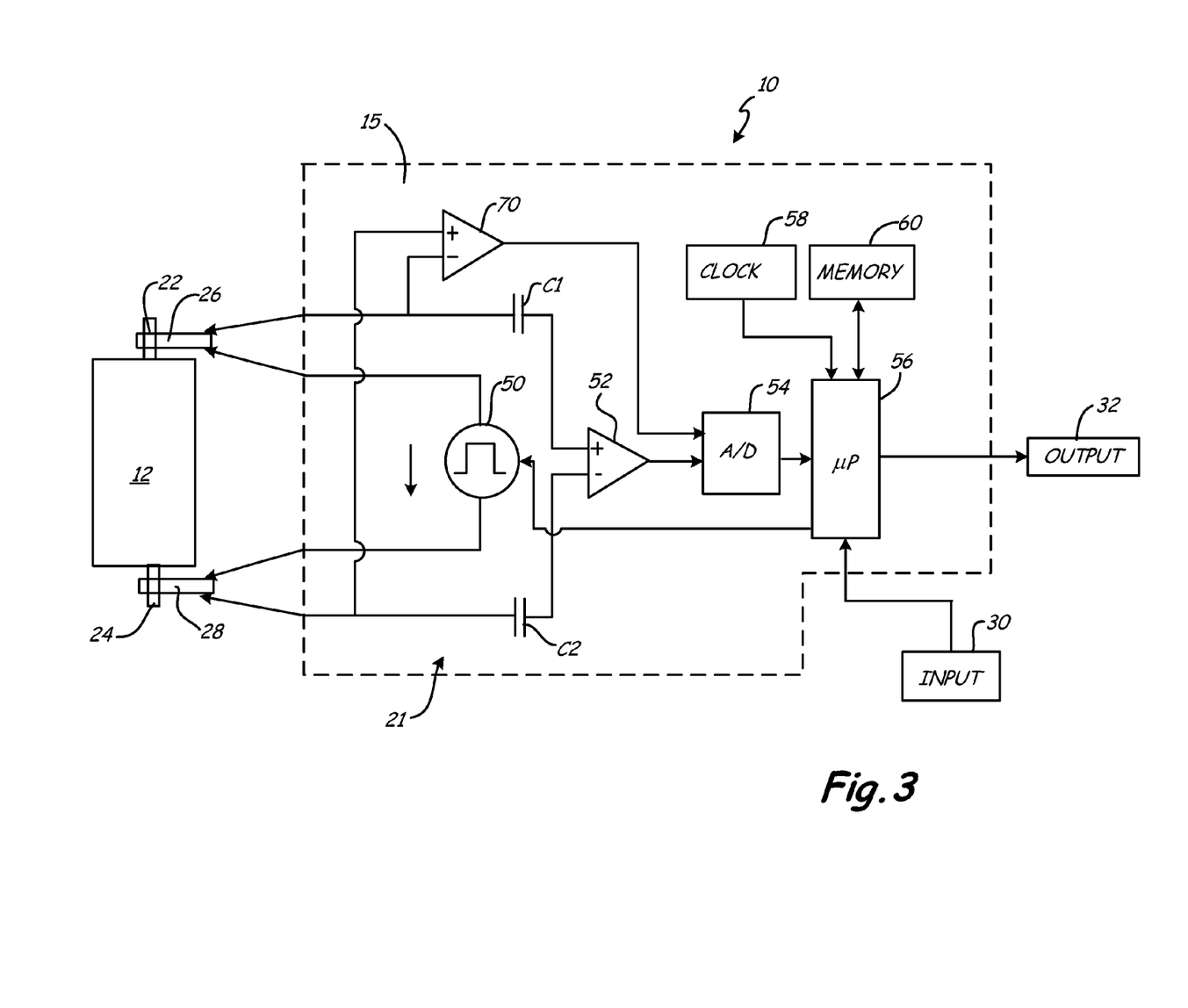
FIG. 3 is a simplified block diagram showing components of test circuitry included in the battery tester of FIG. 1.

FIG. 3 is a simplified block diagram showing components of battery test circuitry 15 in accordance with the present invention. Circuitry 15 operates in accordance with one embodiment of the present invention and determines a conductance ($G_{BAT}$) of battery 12 and a voltage potential ($V_{BAT}$) between terminals or posts 22 and 24 of battery 12. Circuitry 15 includes current source 50, differential amplifier 52, analog-to-digital converter 54 and processing circuitry 56. Current source 50 provides one example of a forcing function for use with the invention. Amplifier 52 is capacitively coupled to battery 12 through capacitors $C_1$ and $C_2$. Amplifier 52 has an output connected to an input of analog-to-digital converter 54. Processing circuitry 56 can be a microprocessor, digital signal processor, etc. Processing circuitry 56 is connected to system clock 58, memory 60, and analog-to-digital converter 54. Processing circuitry 56 is also capable of receiving an input from input device 30. Processing circuitry 56 also connects to output device 32.

In operation, current source 50 is controlled by processing circuitry 56 and provides a current I in the direction shown by the arrow in FIG. 1. In one embodiment, this is a sine wave, square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 15 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24 and is one example of a dynamic response sensor used to sense the time varying response of the battery 18 to the applied time varying forcing function. The output of amplifier 70 is provided to analog-to-digital converter 54 such that the voltage across terminals 22 and 24 can be measured by processing circuitry 56.

Circuitry 15 is connected to battery 12 through a four-point connection technique known as a Kelvin connection. This Kelvin connection allows current I to be injected into battery 12 through a first pair of connections while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to processing circuitry 56. Processing circuitry 56 operates at a frequency determined by system clock 58 and in accordance with programming instructions stored in memory 60.

Processing circuitry 56 determines the conductance of battery 12 by applying a current pulse I using current source 50. This measurement provides a dynamic parameter related to the battery. Of course, any such dynamic parameter can be measured including resistance, admittance, impedance or their combination along with conductance. Further, any type of time varying signal can be used to obtain the dynamic parameter. The signal can be generated using an active forcing function or using a forcing function which provides a switchable load, for example, coupled to the battery 12. The processing circuitry determines the change in battery voltage due to the current pulse I using amplifier 52 and analog-to-digital converter 54. The value of current I generated by current source 50 is known and is stored in memory 60. In one embodiment, current I is obtained by applying a load to battery 12. Processing circuitry 56 calculates the battery conductance (or reciprocally the battery resistance) using the following equation:

$$G_{BAT} = \frac{\Delta I}{\Delta V} \quad \text{Equation 1}$$

where $\Delta I$ is the change in current flowing through battery 12 due to current source 50 and $\Delta V$ is the change in battery voltage due to applied current $\Delta I$. Based upon the measured battery conductance $G_{BAT}$ and the measured battery voltage VBAT, the battery tester 10 determines the condition of battery 12. If battery post adapters 26 and 28 are faulty, the measured battery voltage $V_{BAT}$ will be approximately equal to a rated or normal battery voltage but the measured battery conductance $G_{BAT}$ (or measured cold cranking amps (CCA)) will be inaccurate and substantially lower than a rated CCA of the battery, thereby producing inaccurate test results. It should be noted that the rated battery voltage and the rated CCA are input, via input device 30, prior to conducting the battery test.

In embodiments of the present invention, if test circuitry 15 receives the battery-post-adapter-connection indicator, it carries out multiple (three, for example) consecutive tests on the battery to determine battery conductance and battery voltage. Upon completion of the multiple tests, if the voltage level is normal and the conductance substantially lower than normal, the user is provide with an output indicating that the post adapters are faulty. Thereafter, the user is instructed to replace the battery post adapters and reset the tester in accordance with the methods described earlier.

It should be noted that tester 10 can be a conductance tester, load tester, etc. In general, tester 10 can be any type of battery tester which, in addition to being able to determine the condition of the battery, is also capable of determining whether or not post adapters coupled to the battery posts are faulty. In the above-described embodiments of the present invention, battery conductance is utilized along with battery voltage to determine whether or not the battery posts are faulty. However, instead of battery conductance, other dynamic parameters related to the battery such as resistance, admittance, impedance, or their combinations, may be utilized, without departing from the scope and spirit of the present invention.

Figure 4:
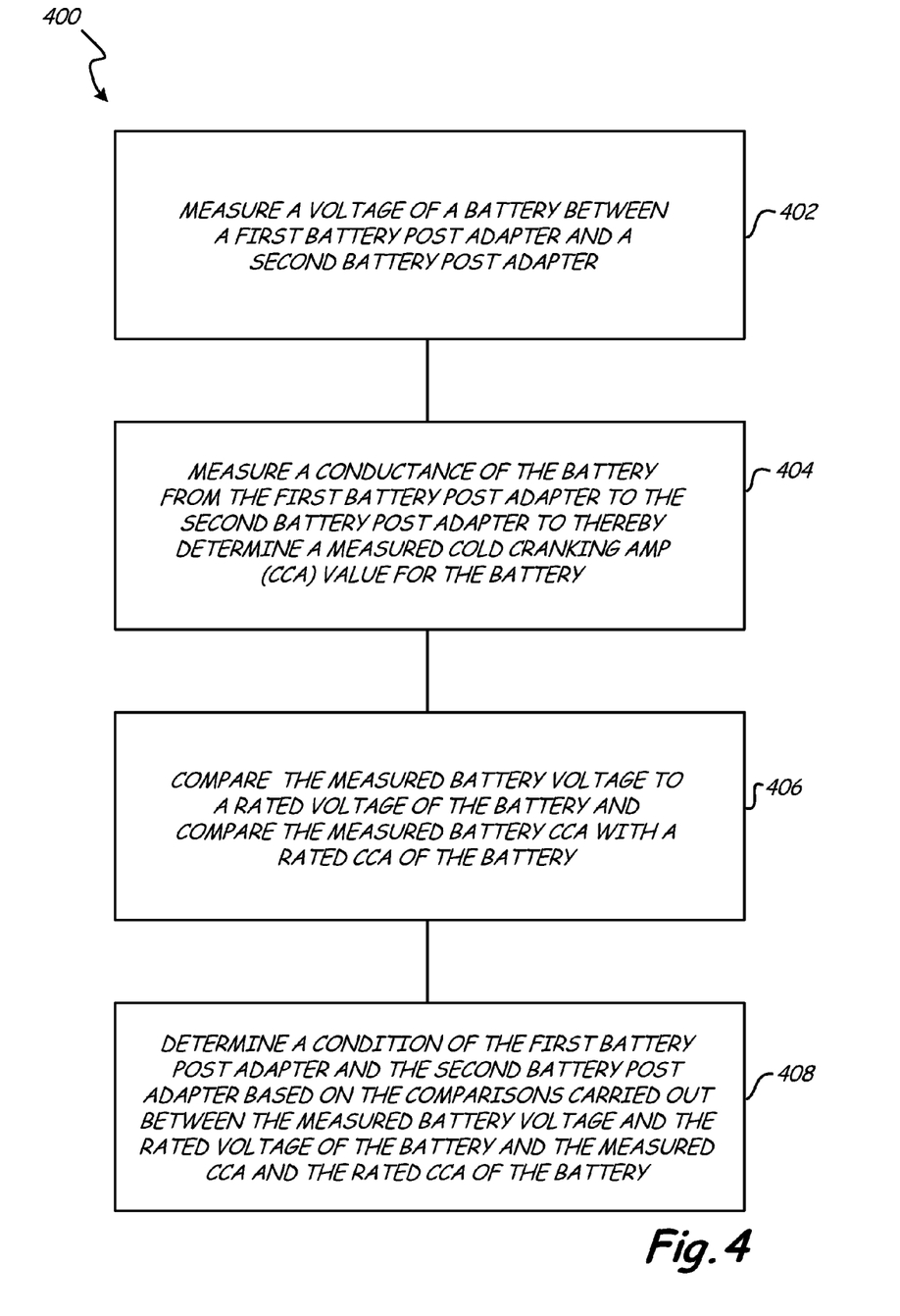
FIG. 4 is a flowchart a method of testing a storage battery to identify faulty battery post adapters in accordance with an embodiment of the present invention.

FIG. 4 is a flowchart 400 of a method of testing a storage battery to identify faulty battery post adapters in accordance with an embodiment of the present invention. At step 402, a voltage of the battery between a first battery post adapter and a second battery post adapter is measured. At step 404, a conductance of the battery from the first battery post adapter and the second battery post adapter is measured to thereby determine a measured cold cranking amp (CCA) value for the battery. At step 406, the measured battery voltage compared to a rated voltage of the battery and the measured battery CCA is compared with a rated CCA of the battery. At step 408, a condition of the first battery post adapter and the second battery post adapter are determined based on the comparisons carried out in step 406. Different techniques, some of which are set forth above, can be employed to carry out the steps shown in the above flowcharts while maintaining substantially the same functionality without departing from the scope and spirit of the present invention.

Although the present invention has been described with reference to preferred embodiments, workers skilled in the art will recognize that changes may be made in form and detail without departing from the spirit and scope of the invention. Although, in the embodiments of FIGS. 1 and 2, a battery with side posts and side post adapters is shown, the present invention is suitable for testing any type of battery coupled to post adapters.

What is claimed is:

1. A method of testing a storage battery having a first terminal and a second terminal, the first terminal being coupled to a first battery post adapter and the second terminal being coupled to a second battery post adapter, the method comprising:
   (a) measuring a voltage of the battery between the first battery post adapter and the second battery post adapter;
   (b) measuring a conductance of the battery from the first battery post adapter and the second battery post adapter to thereby determine a measured cold cranking amp (CCA) value for the battery; and
   (c) comparing the measured battery voltage to a rated voltage of the battery and comparing the measured battery CCA with a rated CCA of the battery; and (d) determining a condition of the first battery post adapter and the second battery post adapter based on the comparisons carried out in step (c).

2. The method of claim 1 and further comprising repeating steps (a) through (d), a predetermined number of times, to verify the condition of the first battery post adapter and the second battery post adapter.

3. The method of claim 1 wherein the determining step (d) comprises determining that the first battery post adapter and the second battery post adapter are faulty if the measured battery voltage is approximately equal to the rated battery voltage and the measured battery CCA is substantially lower than the rated battery CCA.

4. The method of claim 1 and further comprising providing output information relating to a condition of the first battery post adapter and the second battery post adapter.

5. The method of claim 4 wherein the output information further comprises customer service contact information.

* * * * *